(12) United States Patent
Liu et al.

(10) Patent No.: US 8,730,080 B2
(45) Date of Patent: May 20, 2014

(54) ANALOG-TO-DIGITAL CONVERTERS AND PIPELINE ANALOG-TO-DIGITAL CONVERTERS

(75) Inventors: Cong Liu, Anhui (CN); Yu-Kai Chou, Hsinchu (TW)

(73) Assignee: Mediatek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/584,348

(22) Filed: Aug. 13, 2012

(65) Prior Publication Data
US 2013/0038483 A1 Feb. 14, 2013

Related U.S. Application Data

(60) Provisional application No. 61/523,166, filed on Aug. 12, 2011.

(30) Foreign Application Priority Data

Jan. 20, 2012 (CN) .......................... 2012 1 0019221

(51) Int. Cl.
*H03M 1/38* (2006.01)
(52) U.S. Cl.
USPC .......................................... 341/161; 341/155
(58) Field of Classification Search
USPC ........................................ 341/155, 172, 161
See application file for complete search history.

(56) References Cited

U.S. PATENT DOCUMENTS

| | | | | |
|---|---|---|---|---|
| 4,816,831 A | * | 3/1989 | Mizoguchi et al. | ........... 341/156 |
| 6,617,992 B2 | * | 9/2003 | Sakurai | ......................... 341/161 |
| 6,753,801 B2 | * | 6/2004 | Rossi | ............................ 341/161 |

\* cited by examiner

*Primary Examiner* — Brian Young
(74) *Attorney, Agent, or Firm* — McClure, Qualey & Rodack, LLP

(57) ABSTRACT

An analog-to-digital converter is provided. The analog-to-digital converter includes a sampling-voltage providing circuit, a first comparison circuit, a second comparison circuit, and an encoder circuit. The sampling-voltage providing circuit provides a group of first comparison voltages and a group of second comparison voltages. The first comparison circuit performs a first comparison operation to an analog-signal input quantity according to the group of first comparison voltages to generate a first comparison digital quantity. The second comparison circuit selects second comparison voltages among the group of second comparison voltages according to the first comparison digital quantity and performs a second comparison operation to the analog-signal input quantity according to the selected second comparison voltages to generate a second comparison digital quantity. The encoder circuit encodes the first comparison digital quantity and the second comparison digital quantity and generates a digital quantity corresponding to the analog-signal input quantity.

19 Claims, 13 Drawing Sheets

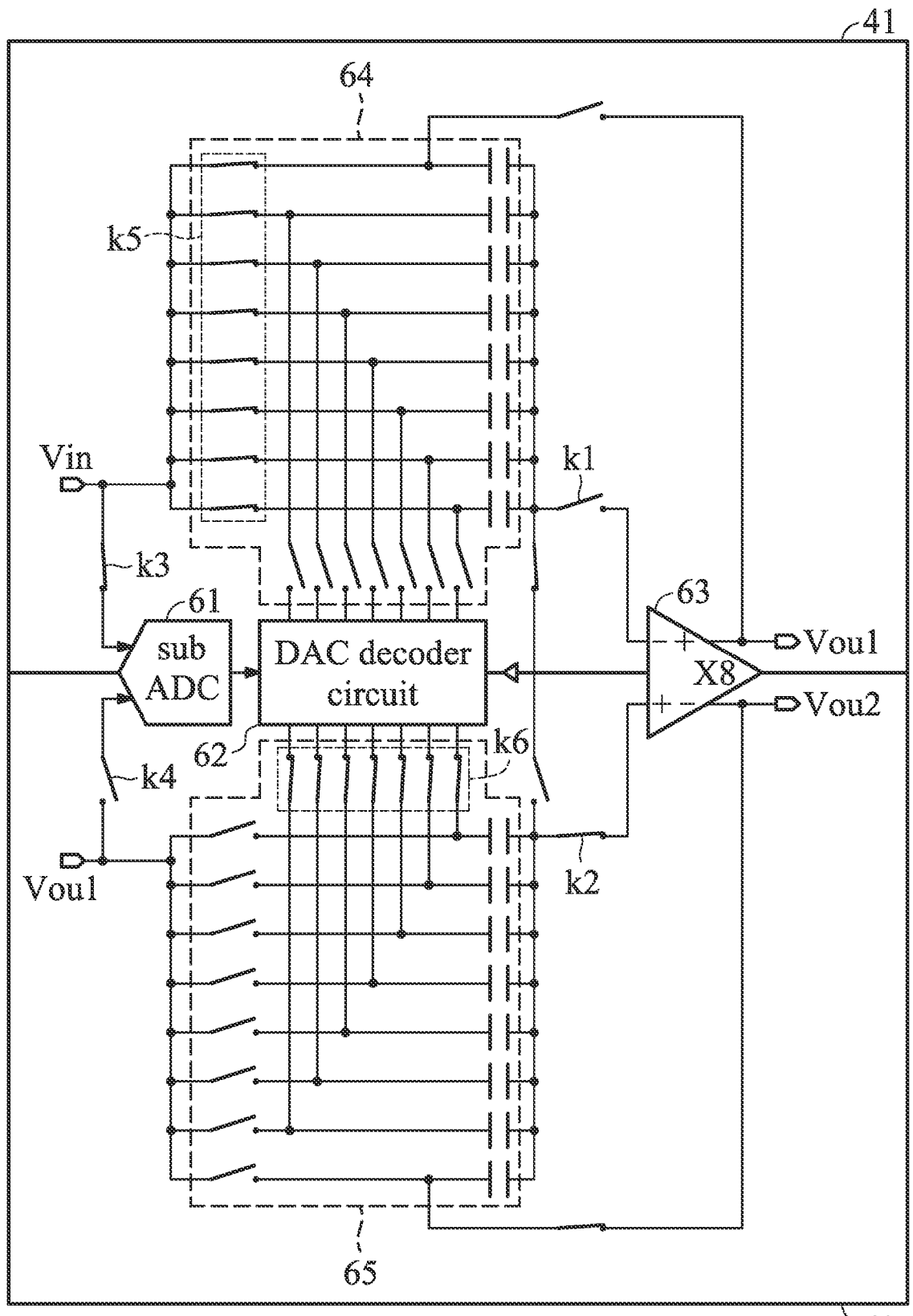
FIG. 6A-a

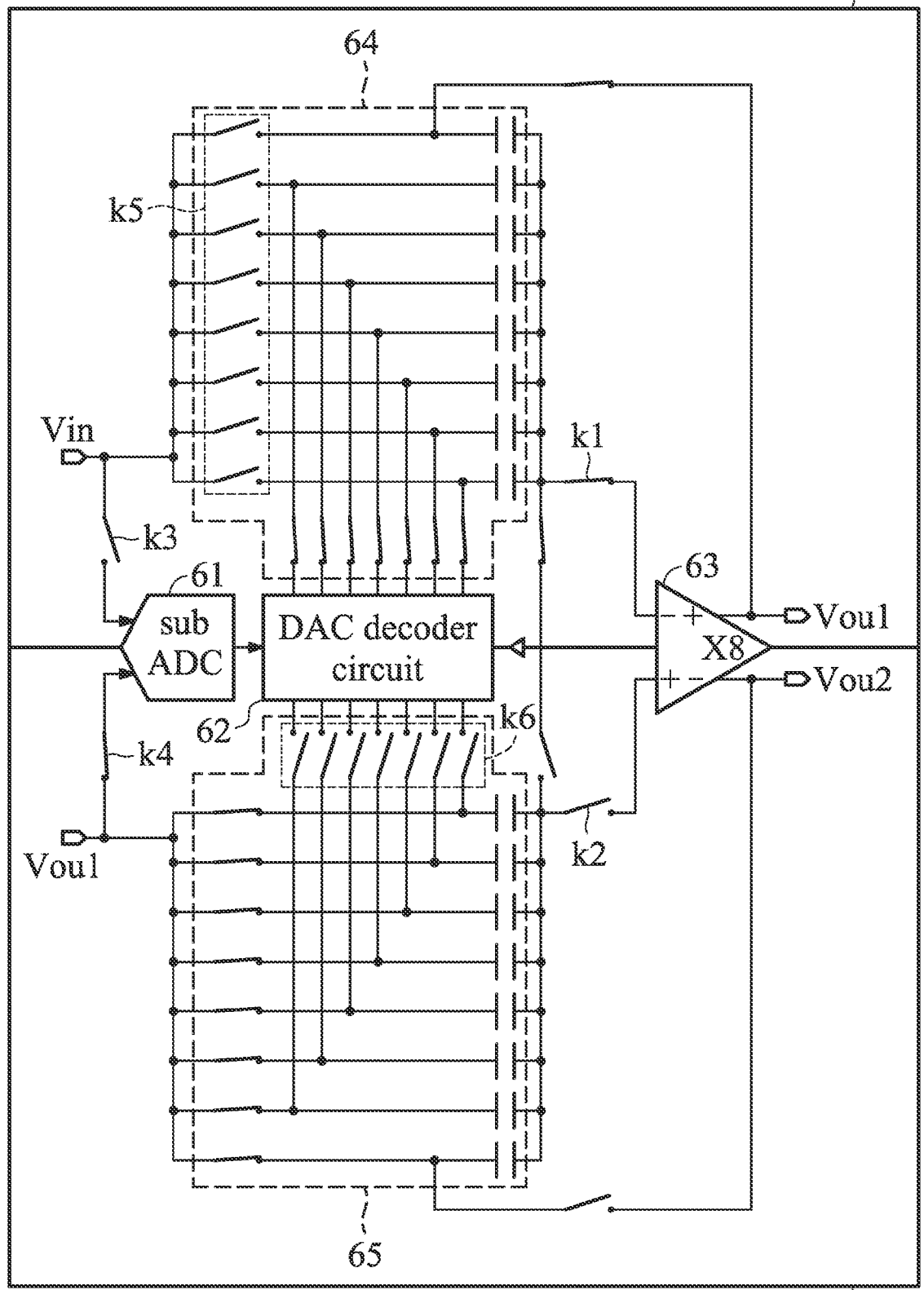
FIG. 6A-b

ANALOG-TO-DIGITAL CONVERTERS AND PIPELINE ANALOG-TO-DIGITAL CONVERTERS

CROSS REFERENCE TO RELATED APPLICATIONS

This application claims the benefit of U.S. Provisional Application No. 61/523,166, filed on Aug. 12, 2011, the contents of which are incorporated herein by reference.

This Application claims priority of China Patent Application No. 201210019221.4, filed on Jan. 20, 2012, the entirety of which is incorporated by reference herein.

BACKGROUND OF THE INVENTION

1. Field of the Invention

The invention relates to an analog-to-digital converter, and more particularly to an analog-to-digital converter with a decreased number of comparators and a pipeline analog-to-digital converter with a decreased number of comparators.

2. Description of the Related Art

In portable digital multimedia consumer electronic systems, analog-to-digital converters (referred to as ADCs) with high speed and low power consumption are required to process analog signals. Pipeline ADCs are ADCs with pipeline structures which can achieve high speed and high precision. The pipeline ADCs have sampling rates reaching dozens of trillions of sampled points per second; even reaching hundreds of trillions of sampled points per second. That is, the sampling rates are dozens of MS/s; even hundreds of MS/s. This characteristic is advantageous for pipeline ADCs, so pipeline ADCs are commonly used in consumer electronic systems.

FIG. 1A is a schematic view showing a conventional pipeline ADC. As shown in FIG. 1A, a pipeline ADC has a multi-stage pipeline circuit structure. The second pipeline circuit stage is given as an example for illustration (refer to the portion surrounded by a dotted line in FIG. 1A). The second pipeline circuit stage comprises a sample-and-hold (referred to as S/H) circuit, a sub ADC circuit, a sub digital-to-analog converter (referred to as sub DAC) circuit, a subtracter circuit, and a residue amplifier circuit. The sub ADC circuit is used to quantify an analog-signal input quantity Vin, perform an analog-to-digital conversion to the quantification result, and output a digital quantity (that is a binary digital signal) corresponding to the analog-signal input quantity Vin. The sub DAC circuit processes the digital quantity output from the sub ADC circuit and outputs an analog-signal quantity. The subtracter circuit performs a subtraction operation to the analog-signal input quantity Vin and the analog-signal quantity output from the sub DAC. Then, the coarse an amplifying operation performed by the residue amplifier circuit, a residue signal Vout of the analog-signal input quantity Vin is obtained. The residue signal Vout serves as the analog-signal input quantity of the next pipeline circuit stage and is processed by the next pipeline circuit stage. In each pipeline circuit stage, the S/H circuit, the sub DAC circuit, the subtracter circuit, and the residue amplifier circuit are generally called a multiplying digital-to-analog converter (referred to as an MDAC).

FIG. 1B is a schematic view showing a 3.5-bit MDAC and a sub ADC circuit in a conventional pipeline ADC. FIG. 1C shows input/output characteristics of the circuit in FIG. 1B. As shown in FIGS. 1B and 1C, for the pipeline ADC circuit with the 3.5-bit precision, the sub ADC circuit 10 comprises fourteen capacitors 101 which are coupled in parallel. Comparison voltages (sampling voltages) at input terminals of the respective comparators 10 are Vr1~Vr14, respectively. That is, there fourteen levels for the sampling voltages. The input/output characteristics of the sub ADC circuit 10 is shown in FIG. 1C, wherein Vr1 is equal to $-\frac{13}{16}Vr$, and Vr14 is equal to $\frac{13}{16}Vr$. In the conventional pipeline ADC, the number of comparators in the sub ADC circuit is equal to fourteen. The total number of comparators is large. Thus, the comparators occupy a large area of the entire circuit, and the power consumption of the pipeline ADC is thus high.

As the above described, the number of comparators in the sub ADC circuit of the conventional pipeline ADC is large, such that the comparators occupy a large area of the entire circuit, and the power consumption of the pipeline ADC is high. Moreover, with the enhancement of the precision level of the pipeline ADC, the number of comparators in the pipeline ADC is increased. Thus, the total size of the pipeline ADC becomes larger, and the power consumption thereof becomes higher.

BRIEF SUMMARY OF THE INVENTION

An exemplary embodiment of the invention provides an analog-to-digital converter. The analog-to-digital converter comprises a sampling-voltage providing circuit, a first comparison circuit, a second comparison circuit, and an encoder circuit. The sampling-voltage providing circuit provides a group of first comparison voltages and a group of second comparison voltages. The first comparison circuit is coupled to the sampling-voltage providing circuit. The first comparison circuit performs a first comparison operation to an analog-signal input quantity according to the group of first comparison voltages to generate a first comparison digital quantity. The second comparison circuit is coupled to the sampling-voltage providing circuit and the first comparison circuit. The second comparison circuit selects second comparison voltages among the group of second comparison voltages according to the first comparison digital quantity and performs a second comparison operation to the analog-signal input quantity according to the selected second comparison voltages to generate a second comparison digital quantity. The encoder circuit is coupled to the first comparison circuit and the second comparison circuit. The encoder circuit encodes the first comparison digital quantity and the second comparison digital quantity and generates a digital quantity corresponding to the analog-signal input quantity.

Another exemplary embodiment of the invention provides a pipeline analog-to-digital converter. The pipeline analog-to-digital converter comprises a plurality of pipeline circuit stages coupled in series. Each of the pipeline circuit stages comprises a sub analog-to-digital converter circuit and a multiplying digital-to-analog converter. The sub analog-to-digital converter circuit comprises a sampling-voltage providing circuit, a first comparison circuit, a second comparison circuit, and an encoder circuit. The sampling-voltage providing circuit provides a group of first comparison voltages and a group of second comparison voltages. The first comparison circuit is coupled to the sampling-voltage providing circuit. The first comparison circuit performs a first comparison operation to an analog-signal input quantity according to the group of first comparison voltages to generate a first comparison digital quantity. The second comparison circuit is coupled to the sampling-voltage providing circuit and the first comparison circuit. The second comparison circuit selects second comparison voltages among the group of second comparison voltages according to the first comparison digital quantity and performs a second comparison operation to the analog-signal input quantity according to the selected second comparison voltages to generate a second comparison digital quantity. The encoder circuit is coupled to the first comparison circuit and the second comparison circuit. The encoder circuit encodes the first comparison digital quantity and the second comparison digital quantity and generates a digital quantity corresponding to the analog-signal input quantity.

A detailed description is given in the following embodiments with reference to the accompanying drawings.

BRIEF DESCRIPTION OF THE DRAWINGS

The invention is fully illustrated by the subsequent detailed description and the accompanying drawings, in which like references indicate similar elements, wherein:

FIG. 6A-$a$ and FIG. 6A-$b$ show an exemplary embodiment of a first MADC, a second MDAC, and a sub ADC circuit in two pipeline circuit stages of a pipeline ADC.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
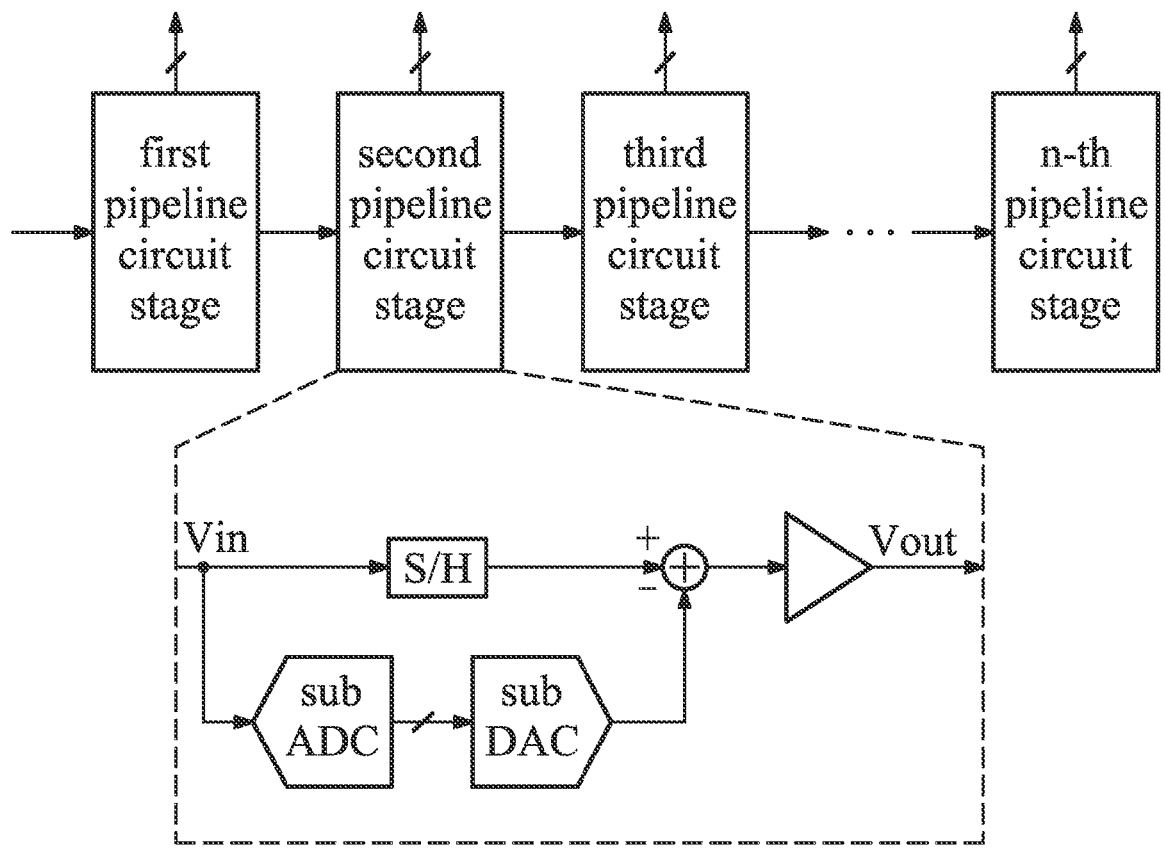
FIG. 1A is a schematic view showing a conventional pipeline analog-to-digital converter (ADC)
Figure 1B:
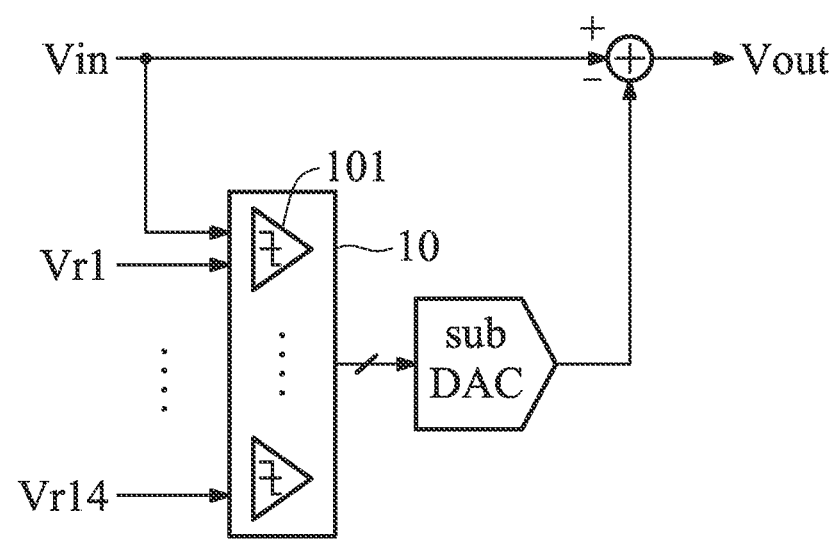
FIG. 1B is a schematic view showing a 3.5-bit multiplying digital-to-analog converter (MDAC) and a sub ADC circuit in a conventional pipeline ADC.
Figure 1C:
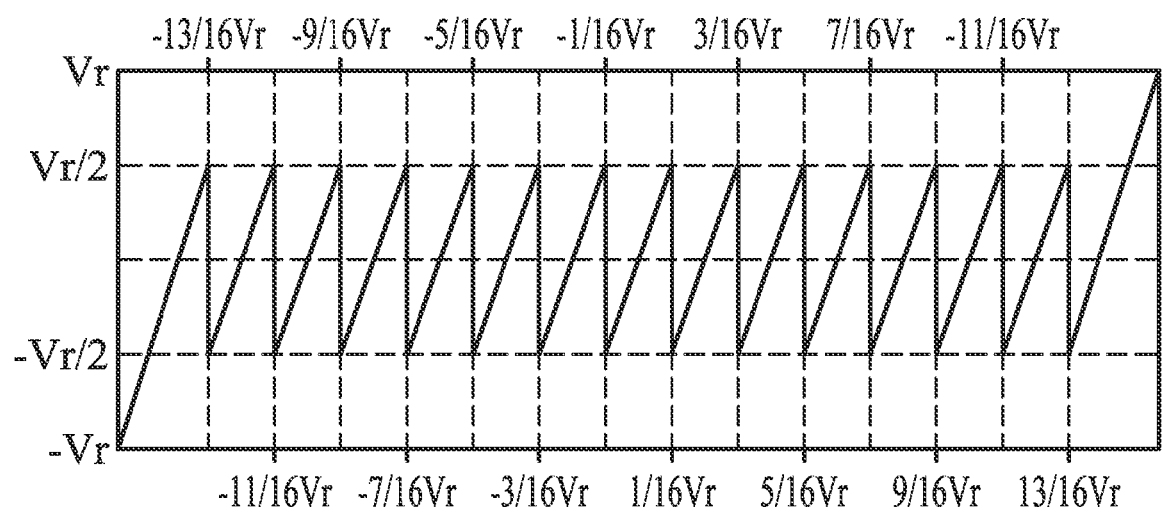
FIG. 1C shows input/output characteristics of the circuit in FIG. 1B.
Figure 2:
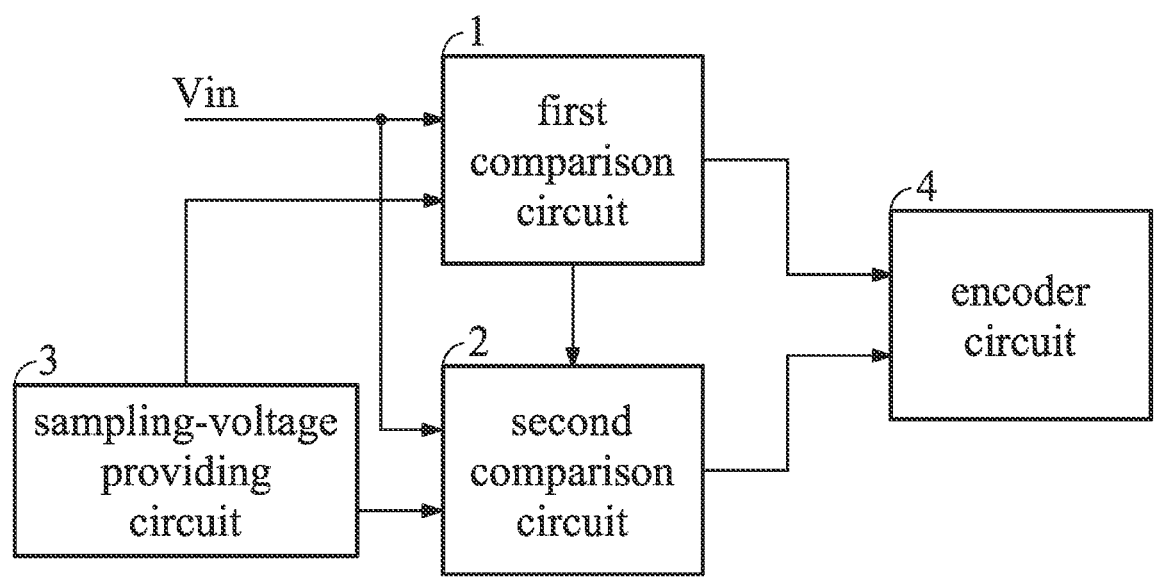
FIG. 2 shows an exemplary embodiment of an ADC.

Analog-to-digital converters (referred to as ADCs) are provided. In an exemplary embodiment of an ADC in FIG. 2, an ADC comprises a first comparison circuit 1, a second comparison circuit 2, a sampling-voltage providing circuit 3, and an encoder circuit 4.

The sampling-voltage providing circuit 3 is arranged to provide a group of first comparison voltages for the first comparison circuit 1 and a group second comparison voltages for the second comparison circuit 2.

The first comparison circuit 1 is coupled to the sampling-voltage providing circuit 3. The first comparison circuit 1 is arranged to perform a first comparison operation to an analog-signal input quantity Vin according to the first comparison voltages to generate a first comparison digital quantity.

The second comparator circuit 2 is coupled to the sampling-voltage providing circuit 3 and the first comparator circuit 1. The second comparator circuit 2 is arranged to select second comparison voltages among the group of second comparison voltages according to the first comparison digital quantity and perform a second comparison operation to the analog-signal input quantity Vin according to the selected second comparison voltages to generate a second comparison digital quantity.

The encoder circuit 4 is coupled to the first comparison circuit 1 and the second comparison circuit 2. The encoder circuit 4 is arranged to encode the first comparison digital quantity and the second comparison digital quantity and generate a digital quantity Vout corresponding to the analog-signal input quantity Vin.

In the embodiment, the above comparison operations for the analog-signal input quantity Vin which are performed by the respective comparison circuits are processes for quantifying the analog-signal input quantity Vin. In the quantification processes, quantified values are obtained according the respective comparison voltages (that is reference voltages). The quantified values are digital signals which are presented by a binary code 0 or 1. The comparison digital quantities output by the respective comparison circuits are digital-signal quantities which are obtained after the quantification processes. The structure of the comparison circuits is similar to or the same as a structure of a conventional comparison circuit.

In the embodiment, the encoder circuit 4 can perform an encoding operation to the comparison digital quantities to obtain a digital quantity according to the analog-signal input quantity Vin. The digital quantity is a digital signal which is presented by a binary code. The encoder circuit 4 operates according to the first comparison digital quantity and the second comparison digital quantity and outputs the digital quantity corresponding to the analog-signal input quantity Vin. The digital quantity can be implemented by binary encoding such that the digital quantity can correspond to the analog signal with various values.

In the embodiment, the first comparison circuit 1 can perform a coarse comparison operation to the analog-signal input quantity Vin. The sampling-voltage providing circuit 3 provides coarse comparison voltages (reference voltages) with wide ranges to respective comparators in the first comparison circuit 1. The first comparison circuit 1 thus outputs the first comparison digital quantity to obtain an approximate range of the analog-signal input quantity Vin. The second comparison circuit 2 then performs a fine comparison operation to the analog-signal input quantity Vin. The sampling-voltage providing circuit 3 also provides fine comparison voltages (reference voltages) with narrow ranges to the second comparison circuit 2. The second comparison circuit 2 selects fine comparison voltages among the fine comparison voltages provided by the sampling-voltage providing circuit 3 according to the comparison result of the first comparison circuit 1. The second comparison circuit 2 performs the fine comparison operation to the analog-signal input quantity Vin according to the selected fine comparison voltages and outputs the second comparison digital quantity to obtain an accurate range of the analog-signal input quantity Vin.

As described above, the first comparison digital quantity represents the approximate range of the analog-signal input quantity Vin and the second comparison digital quantity represents the accurate range of the analog-signal input quantity Vin. Thus, an encoding operation can be performed to the first comparison digital quantity and the second comparison digital quantity to obtain a digital signal corresponding to the analog-signal input quantity Vin.

According to the embodiment, after the first comparison circuit 1 performs the coarse comparison operation to the analog-signal input quantity Vin to obtain an approximate range of the analog-signal input quantity Vin and the second comparison voltages in the approximate range are selected for the fine comparison operation between the selected second comparison voltages and the analog-signal input quantity Vin, the accurate range of the analog-signal input quantity Vin is obtained. Since the second comparison circuit 2 selects the required second comparison voltage according to the coarse comparison result of the first comparison circuit 1, the second comparison circuit 2 just requires a minimal number of comparators to perform a comparison process to analog signals in various ranges. Thus, it is understood that the number of comparators in the comparison circuits is minimal, and the area occupied by the comparators in the entire circuit is small, thereby, lowering power consumption of the entire circuit.

As the above describes, the ADC proposed by the invention performs the comparison operations to the analog-signal input quantity Vin through the two comparison circuits. After the approximate range of analog-signal input quantity Vin is determined by the first comparison circuit, the second comparison circuit performs the respective comparison operation to the analog-signal input quantity Vin in the approximate range, such that the number of comparators in the comparison circuit is decreased effectively. Accordingly, the area occupied by the comparators in the entire circuit is reduced, and the power consumption of the entire circuit is lowered. The ADC of the embodiment may be applied in a pipeline ADC to serve as a sub ADC circuit in each pipeline circuit stage, thereby decreasing the number of comparators in pipeline circuit stages, reducing the area occupied by the comparators, increasing the integration level of the pipeline circuit stages, and lowering the power consumption of the entire circuit.

Figure 3:
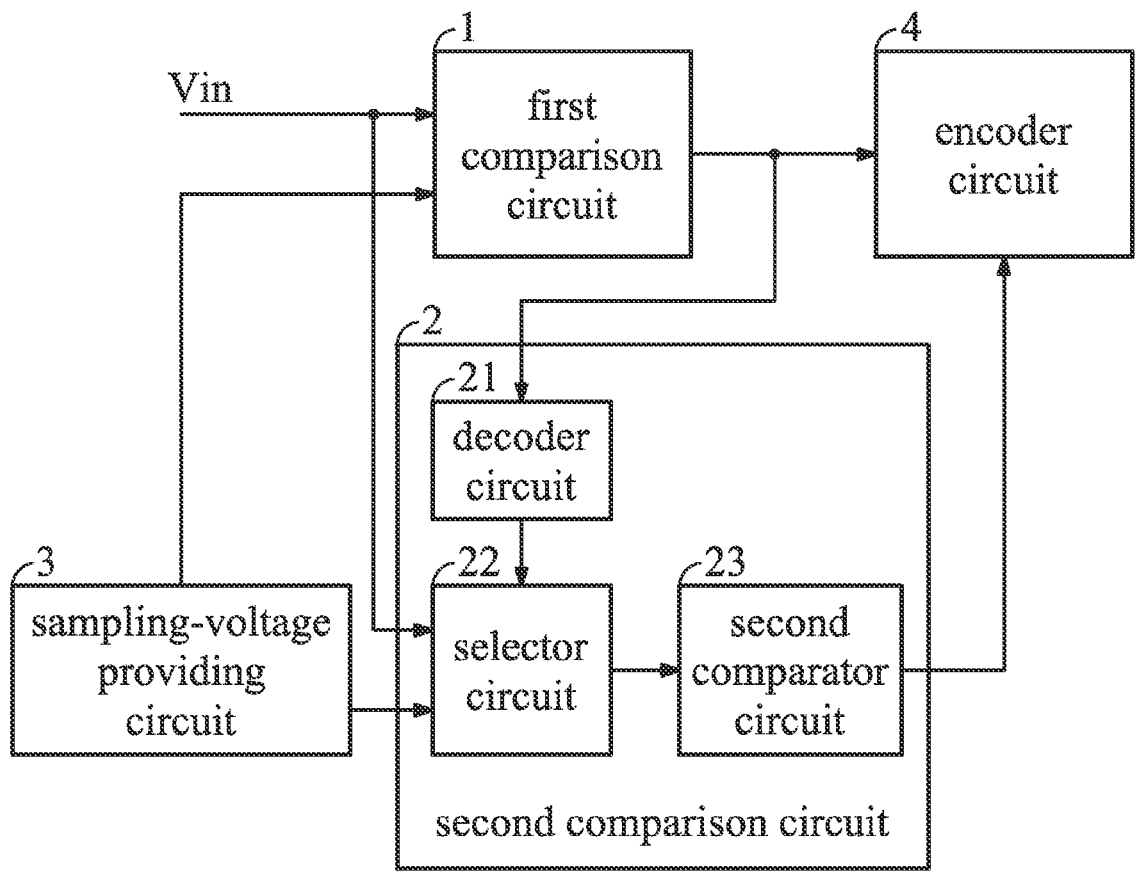
FIG. 3 shows another exemplary embodiment of an ADC.

FIG. 3 shows another exemplary embodiment of an ADC. Referring to FIG. 3, the second comparison circuit 2 shown in FIG. 2 comprises a decoder circuit 21, a selector circuit 22, and a second comparator circuit 23.

The decoder circuit 21 is coupled to the first comparison circuit 1. The decoder circuit 21 performs a decoding operation to the first comparison digital quantity to obtain a selection-signal digital quantity.

The selector circuit 22 is coupled to the decoder circuit 21 and the sampling-voltage providing circuit 3. The selector circuit 22 selects the second comparison voltages among the group of second comparison voltages according to the selection-signal digital quantity and outputs the selected second comparison voltages.

The second comparator circuit 23 is coupled to the selector circuit 22. The second comparator circuit 23 performs the second comparison operation to the analog-signal input quantity Vin to output the second comparison digital quantity.

In the embodiment, the second comparison circuit 2 selects second comparison voltages among the group of second comparison voltages provided by the sampling-voltage providing circuit 3, through the decoder circuit 21 and the selector circuit 22, wherein the selected second comparison voltages are in the approximate range of the analog-signal input quantity Vin which is determined by the first comparison circuit 1. Accordingly, the second comparison circuit 2 can perform the second comparison operation to the analog-signal input quantity Vin according to the selected second comparison voltages to obtain the corresponding comparison result, which is the second comparison digital quantity.

In the embodiment, the decoder circuit 21 and the selector circuit 22 are composed of logic circuits to perform a decoding operation and a signal selection operation. Accordingly, according to the comparison result of the first comparison circuit, the second comparison voltages can be selected for the fine comparison operation performed to the analog-signal input quantity Vin. The number of selected second comparison voltages is equal to the number of comparators in the second comparator circuit 23. In practice, according to the precision level of the ADC, a suitable number of comparators are disposed for satisfying process requirements.

According to the embodiment, the first comparison voltages provided by the sampling-voltage providing circuit 3 are comparison voltages with wide sampling ranges, while the second comparison voltages provided by the sampling-voltage providing circuit 3 are comparison voltages with narrow ranges in the wide sampling ranges. Generally, in each wide range of the comparison voltages, there are many comparison voltages with narrow ranges. Accordingly, after the voltage range of the analog-signal input quantity Vin is determined according to comparison voltages with one wide range, another voltage range of the analog-signal input quantity Vin is determined according to comparison voltages with the narrow range in the wide range to accurately process the analog-signal input quantity Vin. Thus, the obtained digital quantity is much closer to the real value of the analog-signal input quantity Vin.

The ADC of the embodiment can be applied to analog signal processing devices with various precision levels, such an ADC with 2.8 bits and an ADC with 3.5 bits, to decrease the number of comparators in the ADCs. In the following, an ADC with 3.5 bits is given as an example for illustration.

Figure 4A:
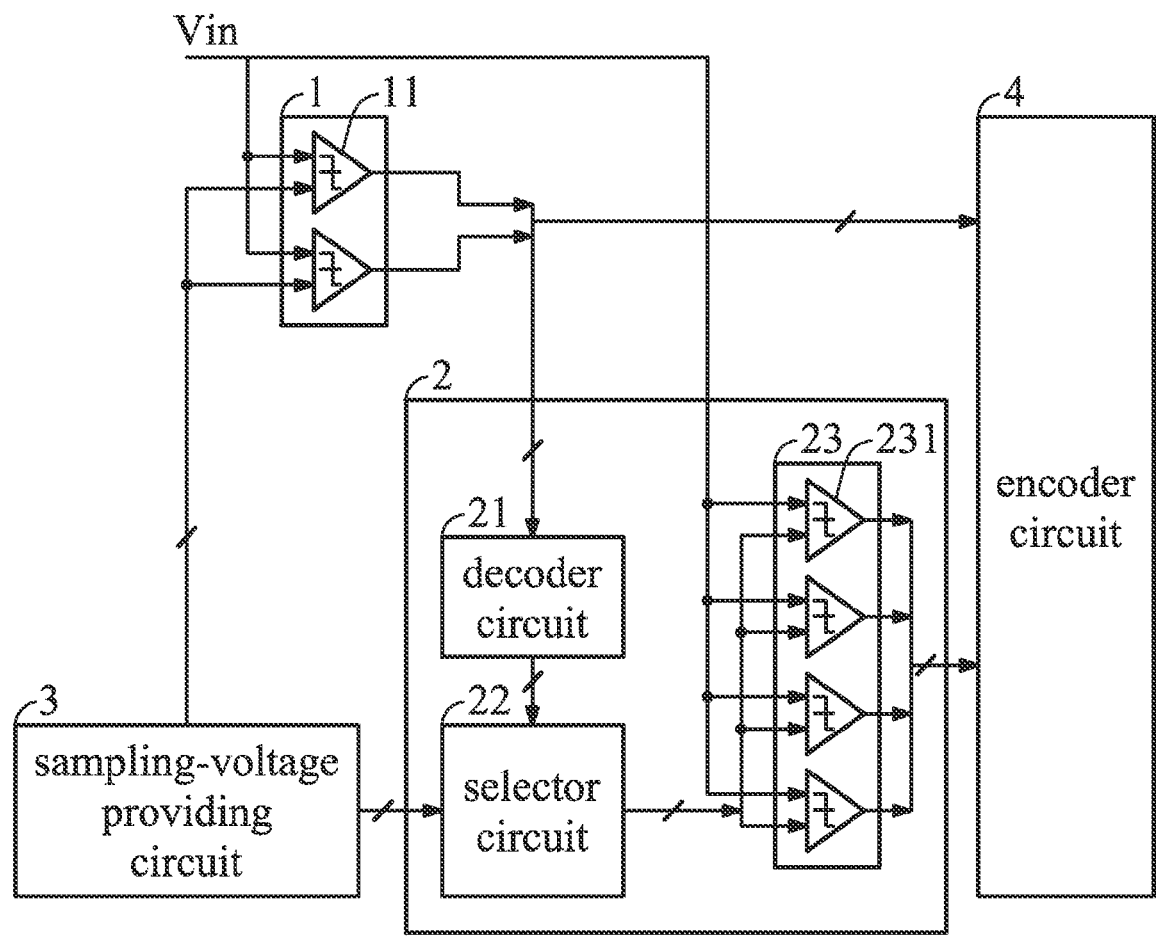
FIG. 4A shows further another exemplary embodiment of an ADC.
Figure 4B:
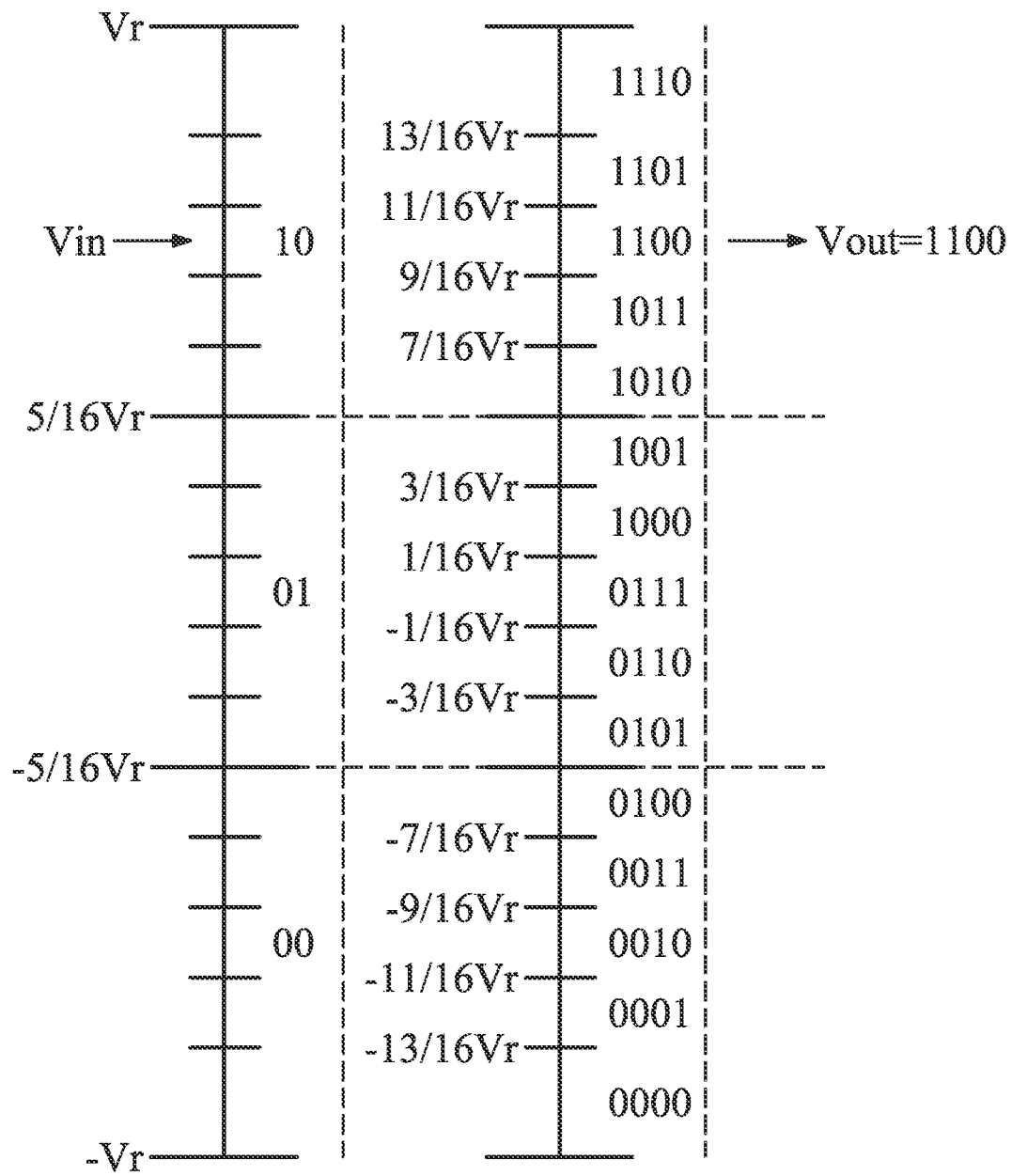
FIG. 4B is a schematic view showing comparison operations of the comparison circuits in FIG. 4A.
Figure 4C:
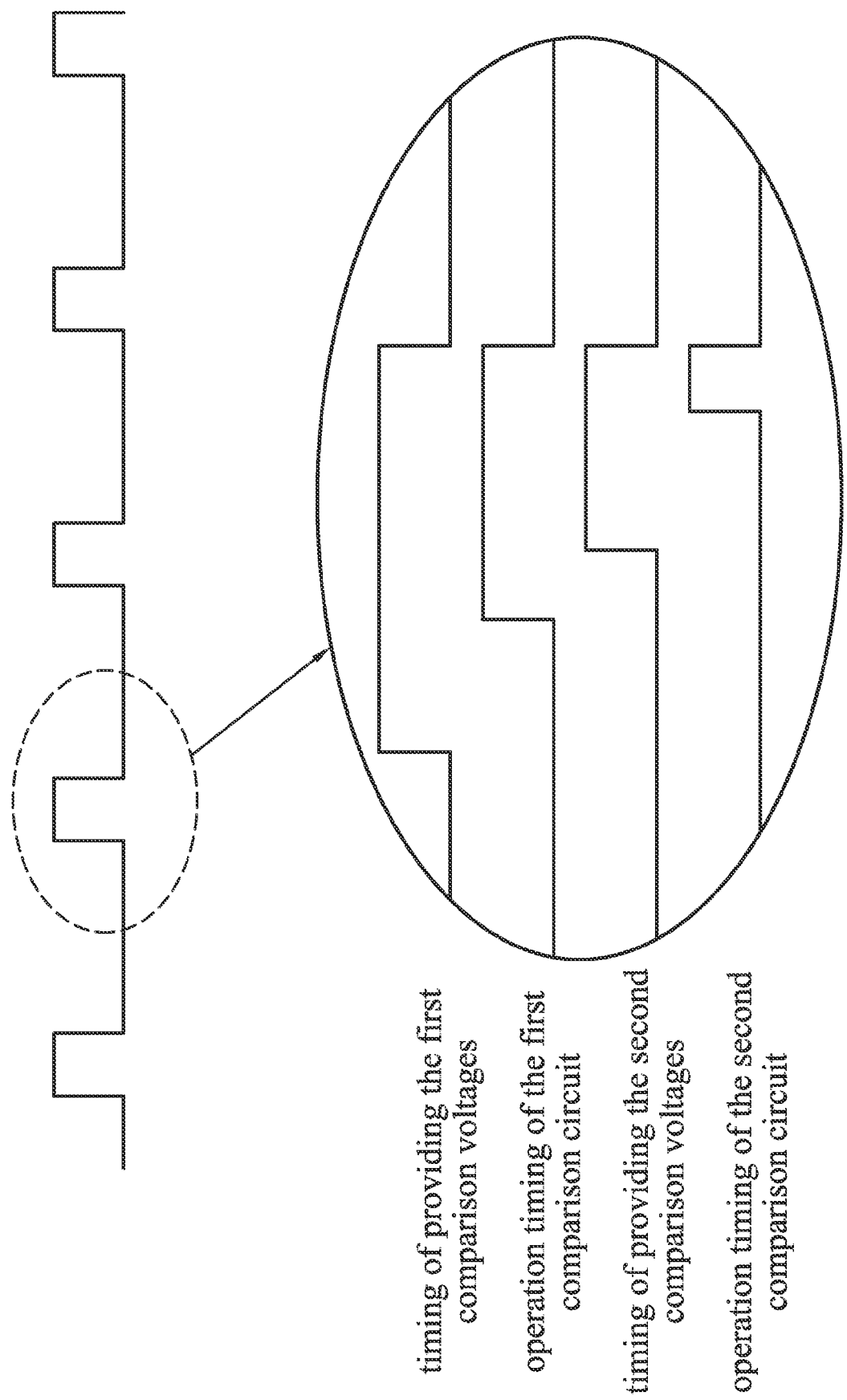
FIG. 4C is an operation timing chart of the ADC in FIG. 4A.

FIG. 4A shows further another exemplary embodiment of an ADC. FIG. 4B is a schematic view showing comparison operations of the comparison circuits in FIG. 4A. FIG. 4C is an operation timing chart of the ADC in FIG. 4A. The ADC of the embodiment can perform a 3.5-bit analog-to-digital conversion. As shown in FIG. 4A, in the ADC, the first comparison circuit 1 comprises two first comparators 11 coupled in parallel, and the second comparison circuit 2 comprises four second comparators 231 coupled in parallel. The number of first comparison voltages provided by the sampling-voltage providing circuit 3 is equal to two, while the number of second comparison voltages provided by the sampling-voltage providing circuit 3 is equal to twelve. The two comparators 11 of the first comparison circuit 1 can perform the first comparison operation to the analog-signal input quantity Vin according to the two first comparison voltages, and then the first comparison circuit 1 outputs the first comparison digital quantity to the decoder circuit 21. The decoder circuit 21 performs the decoding operation to the first comparison digital quantity to generate the selection-signal digital quantity and outputs the selection-signal digital quantity to the selector circuit 22. According to the selection-signal digital quantity, the selector circuit 22 selects four second comparison voltages among the twelve second comparison voltages provided by the sampling-voltage providing circuit 3 to serve as four comparison voltages for the four second comparators 231. The four second comparators 231 perform the second comparison operation to the analog-signal input quantity Vin according to the selected second comparison voltages to generate the second comparison digital quantity. The encoder circuit 4 performs the encoding operation to the first comparison digital quantity generated by the first comparison circuit 1 and the second comparison digital quantity generated by the second comparison circuit to generate the digital quantity corresponding to the analog-signal input quantity Vin. The digital quantity is a 4-bit binary digital-signal quantity.

FIG. 4B is a schematic view showing the comparison operations of the first comparison circuit 1 and the second comparison circuit 2. In the embodiment, the analog-signal input quantity Vin is in the range of $9/16 Vr \sim 11/16 Vr$. The two first comparison voltages (that is, coarse comparison voltages) provided by the sampling-voltage providing circuit 3 are equal to $5/16 Vr$ and $-5/16 Vr$, respectively. The first comparison circuit 1 performs the first comparison operation to the analog-signal input quantity Vin according to the coarse comparison voltages $^5/_{16}$Vr and $-^5/_{16}$Vr to obtain the first comparison result (that is, the first comparison digital quantity) for determining an approximate range of the analog-signal input quantity Vin. In the embodiment, the analog-signal input quantity Vin is between $^5/_{16}$Vr and Vr ($^5/_{16}$Vr~Vr). Then, the second comparison circuit 2 selects comparison voltages between $^5/_{16}$Vr and Vr; that is, fine comparison voltages $^7/_{16}$Vr, $^9/_{16}$Vr, $^{11}/_{16}$Vr, and $^{13}/_{16}$Vr. The second comparison circuit 2 performs the second comparison operation to the analog-signal input quantity Vin according to the four fine comparison voltages to generate the second comparison digital quantity. Then, the digital quantity Vout according to the analog-signal input quantity Vin is obtained according to the first comparison digital quantity and the second comparison digital quantity. In the embodiment, the analog-signal input quantity Vin is between $^7/_{16}$Vr and $^9/_{16}$Vr ($^7/_{16}$Vr~$^9/_{16}$Vr). The digital quantity Vout is represented by a binary code "1100". The relationships between various digital quantities and various values of the analog-signal input quantity Vin are shown in FIG. 4B. According to the embodiment, the first comparison circuit 1 determines an approximate range of the analog-signal input quantity Vin, and then the second comparison circuit 2 selects the comparison voltages in the approximate range to obtain an accurate range of the analog-signal input quantity Vin, thereby obtaining the digital quantity corresponding to the analog-signal input quantity Vin.

FIG. 4C shows the operation timing chart of the sampling-voltage providing circuit 3, the first comparison circuit 1, and the second comparison circuit 2. When the first comparison circuit 1 performs the first comparison operation, the first comparison voltages are provided. After the first comparison circuit 1 accomplishes the first comparison operation, the second comparison voltages are provided for the second comparison circuit 2, and the second comparison circuit 2 performs the second comparison operation. After the first comparison circuit 1 and the second comparison circuit accomplishes the respective comparison operations, one analog-to-digital conversion is completed. Accordingly, the analog-to-digital conversion to the analog-signal input quantity Vin is achieved.

According to the above embodiment, after the first comparison circuit 1 performs a coarse comparison operation to the analog-signal input quantity Vin by using two first comparison voltages, the second comparison circuit 2 performs a fine comparison operation to the analog-signal input quantity Vin by using only four second comparison voltages, thereby determining an accurate range of the analog-signal input quantity Vin. Compared with the ADC with the conventional structures, the number of comparators in the ADC of the embodiment is less than the number of comparators in the conventional ADC by eight; that is, there are only six comparators in the ADC of the embodiment, thereby reducing the area occupied by the comparators in the entire circuit and lowering the power consumption of the entire circuit.

In the embodiment, for achieving processing with a 3.5-bit precision level, two comparators are disposed in the first comparison circuit 1, and four comparators are disposed in the second comparison circuit 2. In practice, the number of comparators in the respective comparison circuits is determined according to system requirements. For example, there is one comparator disposed in the first comparison circuit 1, and the sampling-voltage providing circuit 3 provides one first comparison voltage accordingly. There are seven comparators disposed in the second comparison circuit 2, and the sampling-voltage providing circuit 3 provides fourteen second comparison voltages accordingly. Thus, the processing to the analog-signal input quantity Vin is also achieved, and, preferably, the number of comparators is decreased. Note that, according to the various numbers of comparators, the encoding algorithm which is used to encode the digital quantities output by the comparison circuits may be different.

Figure 4D:
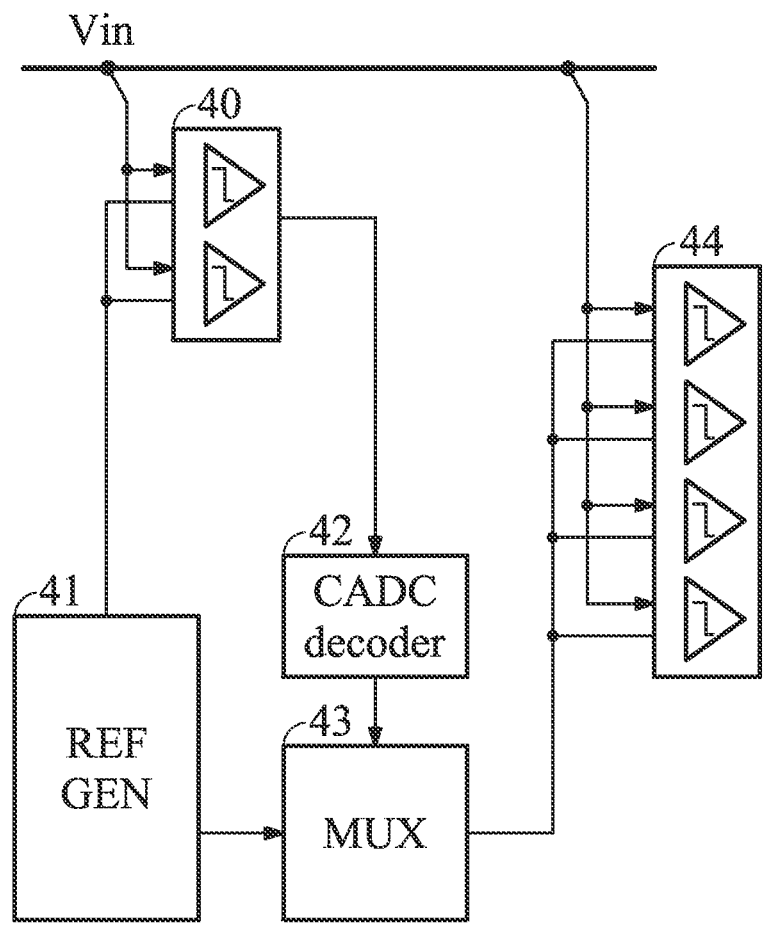
FIG. 4D is a schematic view showing a circuit principle structure of FIG. 4A.

FIG. 4D is a schematic view showing the circuit principle structure of FIG. 4A. In FIG. 4D, a coarse ADC (CADC) 40 corresponds to the first comparison circuit 1 of FIG. 4A, a reference voltage generator (REF GEN) 41 corresponds to the sampling-voltage providing circuit 3 of FIG. 4A, a CADC decoder 42 corresponds to the decoder circuit 21 of FIG. 4A, a multiplexer (MUX) 43 corresponds to the selector circuit 22 of FIG. 4A, and a fine ADC (FADC) 44 corresponds to the second comparator circuit 23 of FIG. 4A.

The structure of a 3.5-bit ADC is described in the above embodiment. However, structures of ADCs with other precision levels, such as 2.8-bit, 4.5-bit, and more higher precision levels, are similar to the structure of the above embodiment. Thus, the descriptions related to the specific structures are omitted here.

The invention further provides a pipeline ADC which comprises a plurality of pipeline circuit stages coupled in series. Each pipeline circuit stage comprises a sub ADC circuit and a multiplying digital-to-analog converter (referred to as MDAC). The sub ADC circuit is implemented by the ADC provided by the above embodiments. For the specific structure of the sub ADC circuit, reference may be made to the description of the above embodiments, thus related descriptions are omitted here.

The structure of the pipeline ADC in the embodiment is the same as or similar to the structure of conventional pipeline ADC. However, the sub ADC circuit of the pipeline ADC in the embodiment is implemented by the ADC provided by the above embodiments. The structures of the other circuits are the same as the structures of the circuits performing the same operations in the convention pipeline ADC. By using the ADC provided by the above embodiments, the number of comparators in the pipeline ADC is decreased, and the power consumption is lowered.

Figure 5:
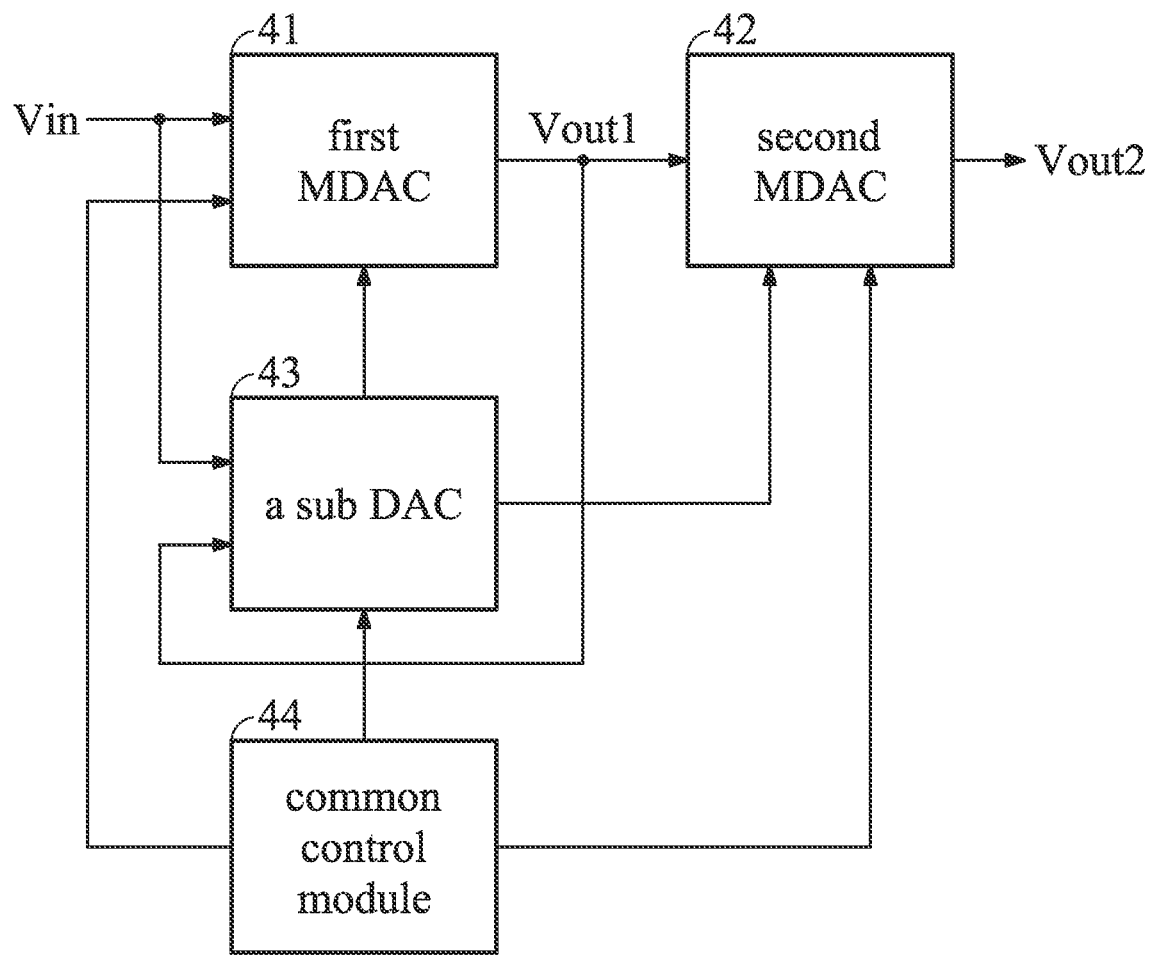
FIG. 5 shows an exemplary embodiment of a pipeline ADC.

FIG. 5 shows an exemplary embodiment of a pipeline ADC. As shown in FIG. 5, in the pipeline ADC of the embodiment, two adjacent pipeline circuit stages comprise a first MDAC 41, a second MDAC 42, a sub DAC 43, and a common control module 44. The common control module 44 controls the first MDAC 41 and the sub ADC circuit 43 at a first control timing to sample an analog-signal input quantity Vin to generate a first output signal Vout1. At a second control timing, the common control module 44 controls the first MDAC 41 to continuously output the first output signal Vout1 and controls the second MDAC 42 and the sub ADC circuit 43 to sample the first output signal Vout1 to generate a second output signal Vout2. Further, at the next control timing, the common control module 44 controls the second MDAC 42 to continuously output the second output signal Vout2. The second output signal Vout2 can be output to the next pipeline circuit stage.

In the embodiment, the two adjacent pipeline circuit stages share one sub ADC circuit 43 to achieve operations of two conventional pipeline circuit stages. As shown in FIG. 5, at the first control timing, the common control module 44 controls the sub ADC circuit 43 and the first MDAC 41 to sample the analog-signal input quantity Vin. At the same time, the sub ADC circuit 43 further performs an analog-to-digital convention operation to the analog-signal input quantity Vin to generate a digital quantity after the quantification. At the second control timing, the common control module 44 controls a sub DAC decoder circuit in the first MADC 41 to process the digital quantity generated by the sub ADC circuit 43 at the first control timing. The processed digital quantity and the sampled analog-signal input quantity Vin by the first MADC 41 are summed, and the summed result is amplified to generate the first output signal Vout1. At the second control timing, the common control module 44 further controls the second MDAC 42 and the sub ADC circuit 43 to sample the first output signal Vout1, and the sub ADC circuit 43 performs the analog-to-digital convention operation to the analog-signal input quantity Vin. At the next control timing, the common control module 44 controls a sub DAC decoder circuit in the second MADC 42 to process the digital quantity generated by the sub ADC circuit 43 at the second control timing. The processed digital quantity and the sampled output signal Vout1 by the second MADC 42 are summed, and the summed result is amplified to generate the second output signal Vout2. Accordingly, the process performed to the analog-signal input quantity Vin is achieved, and the operations of two pipeline circuit stages in a conventional pipeline ADC are also achieved.

In the embodiment, by disposing of the common control module, two MADCs can share one sub ADC circuit to achieve operations of two pipeline circuits, thereby decreasing the number of sub ADC circuit in a pipeline ADC. Accordingly, the number of comparators is decreased, the area occupied by the comparators in the entire circuit is reduced, and the power consumption of the entire circuit is lowered.

In the embodiment, each of the first MADC and the second MADC comprises a sub DAC decoder circuit, a switch-capacitor circuit, and an operational amplifier circuit. Moreover, two MADCs may share one DAC decoder circuit and one operational amplifier circuit. In the following, two adjacent pipeline circuit stages in a pipeline ADC are given as an example for illustration.

Figure 6B:
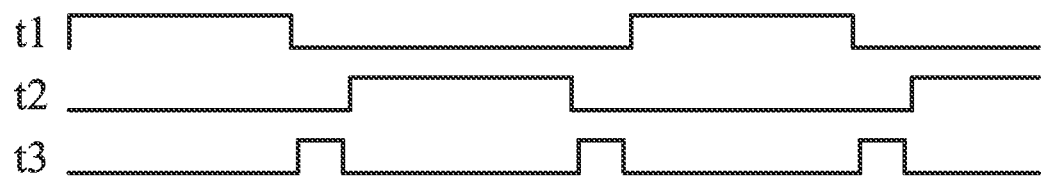
FIG. 6B is an operation timing chart of circuits in FIG. 6A.

FIG. 6A-*a* and FIG. 6A-*b* show an exemplary embodiment of a first MADC, a second MDAC, and a sub ADC circuit in two pipeline circuit stages of a pipeline ADC. FIG. 6B is an operation timing chart of the circuits in FIG. 6A. FIG. 6A shows the structure of the two pipeline circuit stages, wherein FIG. 6A-*a* is a state schematic view when the first MADC operates, and FIG. 6A-*b* is a state schematic view when the second MADC operates. In the embodiment, the first MADC 41 and the second MADC 42 share one sub ADC circuit, one DAC decoder circuit, and one operational amplifier circuit in the MADCs 41 and 42.

In the embodiment, as shown in FIG. 6A-*a* and FIG. 6A-*b*, the two pipeline circuit stages comprise an ADC circuit 61, a DAC decoder circuit 62, an operational amplifier circuit 63, a first switch-capacitor circuit 64, and a second switch-capacitor circuit 65. An output terminal of the first switch-capacitor circuit 64 and an output terminal of the second switch-capacitor circuit 65 are coupled to input terminals of the operational amplifier circuit 63 through switches k1 and k2, respectively. One terminal of the operational amplifier circuit 63 is coupled to an input terminal of the sub ADC circuit 61. Input terminals of the sub ADC circuit 61 are coupled to the analog-signal input quantity (input signal) Vin and one output quantity Vout1 of the operational amplifier circuit 63 through switches k3 and k4, respectively. The sub ADC circuit 61, the DAC decoder circuit 62, the operational amplifier circuit 63, and the first switch-capacitor circuit 64 can achieve the operation of the first MADC 41. The sub ADC circuit 61, the DAC decoder circuit 62, the operational amplifier circuit 63, and the second switch-capacitor circuit 65 can achieve the operation of the second MADC 42. By controlling the switches in the switch-capacitor circuit, the switches between the switch-capacitor circuits and the operational amplifier circuit, and the switch between the output voltage Vout1 of the operational amplifier circuit and the sub ADC circuit, the process of the analog-signal input quantity Vin by the two pipeline circuit stages can be accomplished.

It is known that each switch-capacitor circuit comprises voltage-maintain capacitors, the switches k5 coupled to the analog-signal input quantity, and the switches k6 coupled to the sub DAC decoder circuit. By controlling the switches k5, the corresponding MADC can sample an input signal. By controlling the switches k6, an analog quantity obtained by performing a digital-to-analog conversion operation to a digital signal, which is obtained when an analog-digital conversion operation is performed to the input signal, is summed with the input signal, thereby obtaining a residue signal of the current pipeline circuit stage. The residue signal is processed by the operational amplifier circuit, and the processed residue signal serves as an input signal of the next pipeline circuit stage for processing.

FIG. 6B shows a timing chart of the sampling operations and the signal amplifying operations of the MADCs and the operations of the sub ADC circuit and the operational amplifier circuit. In FIG. 6B, t1 represents the timing of the first MADC performing the sampling operation and the second MADC performing the signal amplifying operation, t2 represent the timing of the second MADC performing the sampling operation and the first MADC performing the signal amplifying operation, and t3 represents the timing of the operations of the sub ADC circuit and the operational amplifier circuit. When the first MADC 41 and the sub ADC circuit sample the input signal Vin (that is at the first control timing), the capacitors in the first MADC 41 are controlled to be coupled to the input signal Vin, and then the sub ADC circuit performs an analog-to-digital conversion operation to the input signal Vin. At the same time, the capacitors in the second MADC 42 are coupled to the operational amplifier circuit and operate at the maintain state. When the second MADC 42 and the sub ADC circuit sample the input signal Vout1 (that is at the second control timing), the capacitors in the second MADC 41 are controlled to be coupled to the input signal Vout1, and then the sub ADC circuit performs an analog-to-digital conversion operation to the input signal Vout1. At the same time, the capacitors in the first MADC 41 are coupled to the operational amplifier circuit and operate at the maintain state. Accordingly, the first MADC 41 and the second MADC 42 can share the sub ADC circuit, sub decoder circuit, and the operational amplifier circuit.

In the embodiment, the sub ADC circuit, sub decoder circuit, the operational amplifier circuit, and the switch-capacitor circuit performs the same operations as convention pipeline ADCs. By controlling the operation timing of the respective function modules, the operations of the above circuits can be shared.

It is known that the above sub ADC circuit can be implemented by a conventional sub ADC. In other embodiments, the above sub ADC circuit can be implemented by the ADC provided in the above embodiments.

Through sharing of the sub ADC circuits, the number of sub ADC circuits in the pipeline ADC is decreased, thereby decreasing the number of comparators used in the entire circuit. The operational amplifier circuits can be shared at the same time, thereby decreasing the number of operational amplifier circuits in the entire circuit. According to the above embodiments, the number of comparators and the number of operational amplifier circuits are decreased. Accordingly, the area occupied by the comparators in the entire circuit is reduced, and the power consumption of the entire circuit is lowered.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter comprising:
    a sampling-voltage providing circuit providing a group of first comparison voltages and a group of second comparison voltages;
    a first comparison circuit, coupled to the sampling-voltage providing circuit, for performing a first comparison operation to an analog-signal input quantity according to the group of first comparison voltages to generate a first comparison digital quantity;
    a second comparison circuit, coupled to the sampling-voltage providing circuit and the first comparison circuit, for selecting second comparison voltages among the group of second comparison voltages according to the first comparison digital quantity and performing a second comparison operation to the analog-signal input quantity according to the selected second comparison voltages to generate a second comparison digital quantity; and
    an encoder circuit, coupled to the first comparison circuit and the second comparison circuit, for encoding the first comparison digital quantity and the second comparison digital quantity and generating a digital quantity corresponding to the analog-signal input quantity,
    wherein the second comparison circuit comprises:
    a decoder circuit, coupled to the first comparison circuit, for performing a decoding operation to the first comparison digital quantity to obtain a selection-signal digital quantity.

2. The analog-to-digital converter as claimed in claim 1, wherein the second comparison circuit further comprises:
    a selector circuit, coupled to the decoder circuit and the sampling-voltage providing circuit, for selecting the second comparison voltages among the group of second comparison voltages according to the selection-signal digital quantity and outputting the selected second comparison voltages.

3. The analog-to-digital converter as claimed in claim 2, wherein the second comparison circuit further comprises:
    a second comparator circuit, coupled to the selector circuit, for performing the second comparison operation to the analog-signal input quantity to output the second comparison digital quantity.

4. The analog-to-digital converter as claimed in claim 3, wherein the analog-to-digital converter is a 4-bit analog-to-digital converter.

5. The analog-to-digital converter as claimed in claim 4, wherein the first comparison circuit comprises two first comparators coupled in parallel and the second comparison circuit comprises four second comparators coupled in parallel.

6. The analog-to-digital converter as claimed in claim 5, wherein the sampling-voltage providing circuit provides two first comparison voltages and twelve second comparison voltages.

7. The analog-to-digital converter as claimed in claim 4, wherein the first comparison circuit comprises one first comparator, and the second comparison circuit comprises seven second comparators coupled in parallel.

8. The analog-to-digital converter as claimed in claim 7, wherein the sampling-voltage providing circuit provides one first comparison voltage and fourteen second comparison voltages.

9. A pipeline analog-to-digital converter comprising a plurality of pipeline circuit stages coupled in series, wherein each of the pipeline circuit stages comprises a sub analog-to-digital converter circuit and a multiplying digital-to-analog converter, and the sub analog-to-digital converter circuit comprises:
    a sampling-voltage providing circuit providing a group of first comparison voltages and a group of second comparison voltages;
    a first comparison circuit, coupled to the sampling-voltage providing circuit, for performing a first comparison operation to an analog-signal input quantity according to the group of first comparison voltages to generate a first comparison digital quantity;
    a second comparison circuit, coupled to the sampling-voltage providing circuit and the first comparison circuit, for selecting second comparison voltages among the group of second comparison voltages according to the first comparison digital quantity and performing a second comparison operation to the analog-signal input quantity according to the selected second comparison voltages to generate a second comparison digital quantity; and
    an encoder circuit, coupled to the first comparison circuit and the second comparison circuit, for encoding the first comparison digital quantity and the second comparison digital quantity and generating a digital quantity corresponding to the analog-signal input quantity.

10. The pipeline analog-to-digital converter as claimed in claim 9, wherein the second comparison circuit comprises:
    a decoder circuit, coupled to the first comparison circuit, for performing a decoding operation to the first comparison digital quantity to obtain a selection-signal digital quantity.

11. The pipeline analog-to-digital converter as claimed in claim 10, wherein the second comparison circuit further comprises:
    a selector circuit, coupled to the decoder circuit and the sampling-voltage providing circuit, for selecting the second comparison voltages among the group of second comparison voltages according to the selection-signal digital quantity and outputting the selected second comparison voltages.

12. The pipeline analog-to-digital converter as claimed in claim 11, wherein the second comparison circuit further comprises:
    a second comparator circuit, coupled to the selector circuit, for performing the second comparison operation to the analog-signal input quantity to output the second comparison digital quantity.

13. The pipeline analog-to-digital converter as claimed in claim 12, wherein the sub analog-to-digital converter circuit is a 4-bit analog-to-digital converter.

14. The pipeline analog-to-digital converter as claimed in claim 13, wherein the first comparison circuit comprises two first comparators coupled in parallel, and the second comparison circuit comprises four second comparators coupled in parallel.

15. The pipeline analog-to-digital converter as claimed in claim 14, wherein the sampling-voltage providing circuit provides two first comparison voltages and twelve second comparison voltages.

16. The pipeline analog-to-digital converter as claimed in claim 13, wherein the first comparison circuit comprises one first comparator, and the second comparison circuit comprises seven second comparators coupled in parallel.

17. The pipeline analog-to-digital converter as claimed in claim 16, wherein the sampling-voltage providing circuit provides one first comparison voltage and fourteen second comparison voltages.

18. The pipeline analog-to-digital converter as claimed in claim 9, wherein two adjacent pipeline circuit stages among the pipeline circuit stages comprises a first multiplying digital-to-analog converter, a second multiplying digital-to-analog converter, a sub analog-to-digital converter circuit, and a common control module.

19. The pipeline analog-to-digital converter as claimed in claim 18,
wherein at a first control timing, the common control module controls the first multiplying digital-to-analog converter and the sub analog-to-digital converter circuit to sample the analog-signal input quantity to generate a first output signal,
wherein at a second control timing, the common control module controls the first multiplying digital-to-analog converter to continuously output the first output signal and controls the second multiplying digital-to-analog converter and the sub analog-to-digital converter circuit to sample the first output signal to generate a second output signal, and
wherein at the next control timing following the second control timing, the common control module controls the second multiplying digital-to-analog converter to continuously output the second output signal.

* * * * *